United States Patent [19]

Tantraporn et al.

[11] 4,129,879

[45] Dec. 12, 1978

[54] VERTICAL FIELD EFFECT TRANSISTOR

[75] Inventors: Wirojana Tantraporn; Se P. Yu, both of Schenectady, N.Y.

[73] Assignee: General Electric Company, Schenectady, N.Y.

[21] Appl. No.: 908,508

[22] Filed: May 22, 1978

Related U.S. Application Data

[63] Continuation-in-part of Ser. No. 789,516, Apr. 21, 1977, abandoned.

[51] Int. Cl.² .................................................. H01L 29/80
[52] U.S. Cl. ........................................ 357/22; 357/23; 357/46
[58] Field of Search ............................. 357/22, 23, 56

[56] References Cited

U.S. PATENT DOCUMENTS

| 3,761,785 | 9/1973 | Pruniaux ........................... 357/22 |
| 3,851,379 | 12/1974 | Gutknecht et al. .................. 357/23 |

*Primary Examiner*—Edward J. Wojciechowicz
*Attorney, Agent, or Firm*—Donald R. Campbell; Joseph T. Cohen; Marvin Snyder

[57] ABSTRACT

An interdigitated field effect transistor for high power, high frequency applications has a vertical configuration with current flow essentially normal to the surface, as compared to planar devices in which current flow is parallel to the surface. Each channel region is of the same conductivity type as the source and drain regions and is in a mesa structure surrounded by the gate metallization such that the gate metal forms an electronically blocking contact to the channel semiconductor. The device geometry has a natural strip line configuration.

6 Claims, 9 Drawing Figures

VERTICAL FIELD EFFECT TRANSISTOR

The present application is a continuation-in-part of application Ser. No. 789,516, filed on Apr. 21, 1977, now abandoned.

BACKGROUND OF THE INVENTION

This invention relates to high frequency semiconductor devices, and more particularly to a field effect transistor with a vertical structure for high power, high frequency applications.

Conventional field effect transistors are planar devices with the source, gate and drain electrodes on the same surface of the semiconductor and the current flow substantially along the surface. The most advanced field effect transistor for high power, high efficiency applications is a planar device fabricated on a gallium arsenide layer of n-type conductivity that has been epitaxially grown on a semi-insulating gallium arsenide substrate (see FIG. 1). The source and drain electrodes are metals ohmically attached to the gallium arsenide layer, which may be locally doped or defined by mesa etching to facilitate the ohmicity of the contact, and the gate electrode is a metal which forms a Schottky blocking contact to the gallium arsenide layer. Fabrication problems exist in delineating with sufficient resolution the source-gate and gate-drain spacing. For high frequency applications the gate-drain spacing is of the order of one micron or less in order to take advantage of a higher saturation velocity of the electron in gallium arsenide before the intervalley transfer mechanism sets in. Such a small dimension requires the utmost in lithographic resolution in the device fabrication. Other factors limiting the efficient utilization of the field effect transistor at high or microwave frequencies include the parasitic series resistance in the source and drain, the resistance of the gate metal, and various inductances such as the inductance of the grounding leads for the source. For high power application, the gate metal "line" acts as a lossy transmission line, thus limiting the useful size of the device.

The semi-insulating substrate presents several problems. Heat sinking is not divorced from circuit considerations due to the presence of a thick semi-insulating substrate. Such a substrate normally contains a large concentration of various impurities, but the activated carriers are so compensated as to have little electrical conductivity. The deep impurity levels may act as traps and become charged, thus affecting the performance of the active layer. It is also believed that the radiation damage affecting field effect transistor performance is a manifestation of the charged states in the semi-insulating substrate.

The VMOS (vertical metal-oxide-semiconductor) transistor with a V groove configuration is essentially a planar or single surface device on the folded surfaces of the groove.

The objects of the present invention are to improve the performance of the field effect transistor and achieve a higher power level and higher frequency by means of a novel configuration which allows minimization of the parasitics, has improved circuit simplicity and heat sinking, makes better utilization of the semiconductor area within the maximum dimensions determined by the wavelength, and avoids the need for a semi-insulating substrate.

SUMMARY OF THE INVENTION

The field effect transistor according to the invention has a "vertical" structure in which current flow is essentially normal to the surface. A unit transistor is comprised of a heavily doped semiconductor layer on which is formed a mesa structure including a moderately doped semiconductor layer and another heavily doped semiconductor layer, all of said layers being of the same conductivity type, with metallizations on the external surfaces of the outer layers. The entire inner layer extending from side edge to side edge of the mesa without interruption is the channel region, while one outer layer and metallization are the source region and source contact and the other outer layer and metallization are the drain region and drain contact. The gate metallization and an underlying insulating layer may be continuous and are attached to the first-mentioned outer semiconductor layer completely surrounding the mesa structure, and the gate metallization is adjacent to the side edges of the inner layer and defines an electronically blocking contact to the channel region. The gate metal and channel semiconductor form a Schottky junction, or there can be an applied insulating layer between the gate metal and channel semiconductor providing an insulated gate structure.

The exemplary embodiment is an interdigitated, n-channel depletion mode, microwave field effect transistor made of gallium arsenide and having a Schottky gate metal. The vertical field effect transistor structure avoids many circuit limitations of prior devices so that higher power is achieved at higher operating frequencies. For instance, the device geometry has a natural strip line circuit configuration, and other advantages over the planar F.E.T. are tabulated.

DESCRIPTION OF THE PREFERRED EMBODIMENTS

Figure 1:
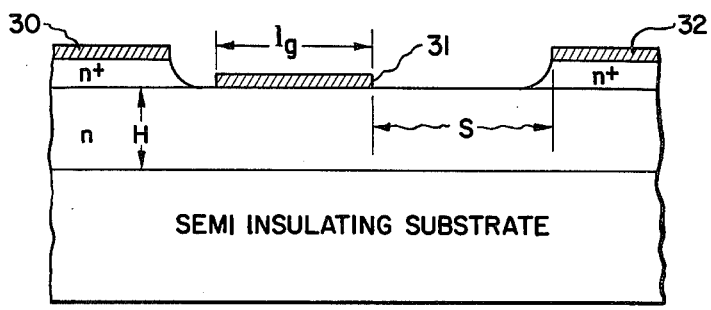
FIG. 1 is a diagrammatic cross section of a prior art planar field effect transistor.
Figure 2:
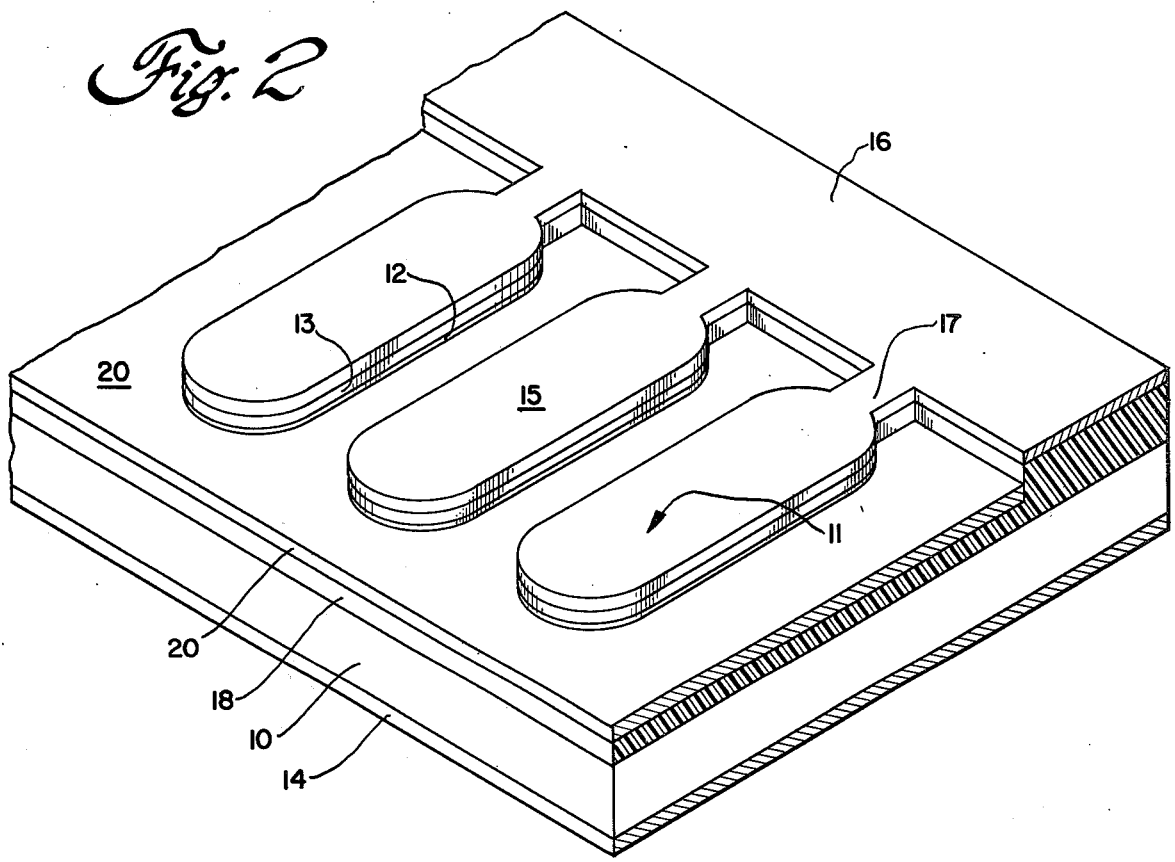
FIGS. 2 and 3 are schematic perspective and cross sectional views of the vertical field effect transistor for high power and high frequency applications according to the preferred embodiment of the invention.
Figure 3:
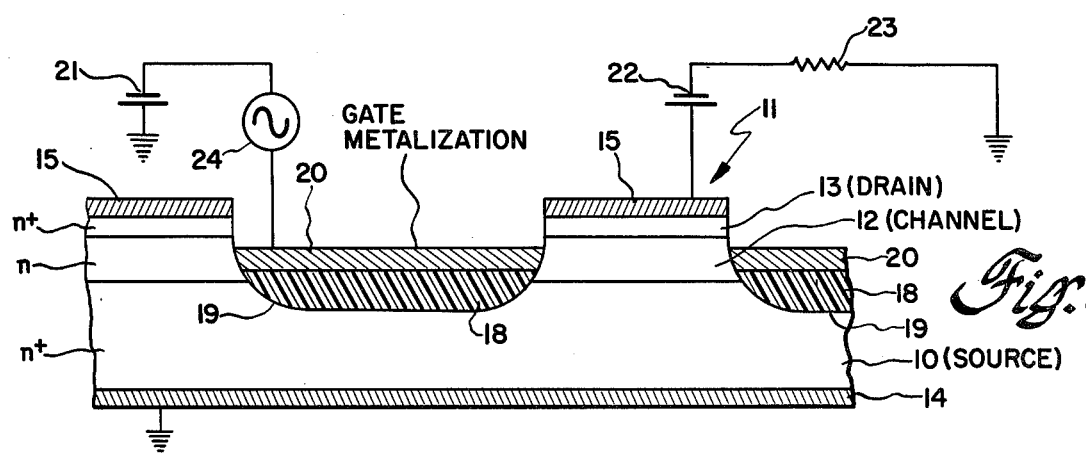

The field effect transistor in FIGS. 2 and 3 has a "vertical" configuration, which can be said to mimic the vacuum tube geometry, and attains higher power at a higher frequency of operation than the conventional planar field effect transistor in FIG. 1. Current flow in the vertical field effect transistor structure is essentially normal to the surface, rather than being essentially parallel to the surface as in the prior art planar device. The exemplary embodiment is an n-channel depletion mode field effect transistor made of gallium arsenide, but n-channel enhancement mode and p-channel depletion mode and enhancement mode devices are also possible, and other semiconductor materials such as silicon and indium phosphide can be used. An interdigitated geometry is most advantageous and is necessary for high power, high frequency applications, however a single device is within the scope of the invention as more broadly defined.

In FIGS. 2 and 3, the interdigitated vertical field effect transistor is comprised of a heavily doped n+ substrate or outer semiconductor layer 10 upstanding from which are a plurality of parallel elongated mesa structures 11 of a type commonly referred to as fingers or stripes. The individual mesa structures include a moderately doped n-type inner semiconductor layer 12 functioning as the channel region in the transistor, and on overlying heavily doped n+ outer semiconductor layer 13 providing the drain region. Substrate layer 10 is the common source for all the unit transistors and a continuous ohmic contact metallization is applied to the bottom or external surface of the substrate to serve as the source contact 14. Ohmic contact metallizaton is also applied to the top or external surfaces of the drain regions 13 to serve as isolated drain contacts 15 for the multiple fingers of the transistors. A landing pad or interconnection metallization 16 is deposited on a thick insulator layer on one side of the device and is coupled to the mesa structure drain metallizations 15 as by means of beam leads 17.

A continuous source-gate insulating layer 18 is deposited on the upper surface of substrate 10, extending into a groove or depression 19 in the upper surface which encircles all the mesa structures 11. A continuous gate contact metallization 20 is applied over insulating layer 18 and thus also completely surrounds each mesa structure, and is oriented vertically so as to approximately be in the same plane as inner semiconductor layers 12, i.e., the channel regions, and has a thickness no greater than the thickness of the inner semiconductor layers. FIG. 3 depicts a cross section of the device showing the gate metal in a groove between the two mesa structures. The gate metallization forms a Schottky junction or electronically blocking contact to gallium arsenide. In the "vertical" field effect transistor structure, it is the edges of the gate metallization in abutment with the side edges of inner semiconductor layer 12, rather than the lower major surface of the gate metal, that defines an electronically blocking contact to the channel region. The mesa cross section shows the active semiconductor layer 12 as a rectangle bounded above by drain 13, below by source 10, and by the Schottky gate metallization 20 on both sides. With sufficient negative gate potential, the space charge layer will extend toward the center of the channel region, narrowing the conductive channel connecting the source and drain regions 10 and 13, and at pinch off the entire channel region in every unit transistor is nonconducting. It is evident in FIG. 3 that the device geometry with only two electrodes on the top side and the source electrode as the ground plane, has a natural strip line circuit configuration which is desirable to attain high power at high frequencies. For depletion mode operation, source metallization 14 is grounded, a negative dc bias is supplied to gate metallization 20 by bias source 21, and a positive potential is applied to drain metallization 15 by bias source 22 which in turn is coupled to load 23. An ac source 24 varies the gate voltage and controls the channel conductivity in known manner, current flow being normal to the surface. The channel region consists of the entire layer 12 and extends without interruption from edge to edge of the mesa in every unit transistor. That is, when fully conductive the entire width of the inner semiconductor layer in the mesa (the channel region) is active.

Figure 4:
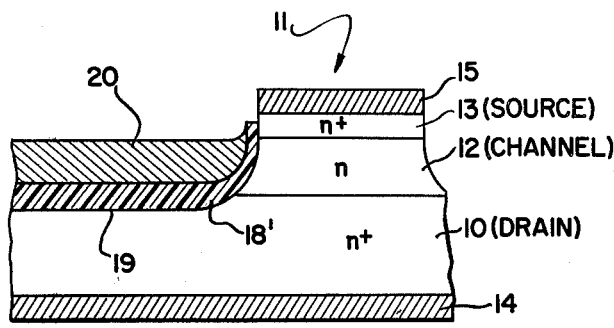
FIG. 4 is a fragmentary cross section of a modification of FIG. 3 having an insulated gate structure.
Figure 7:
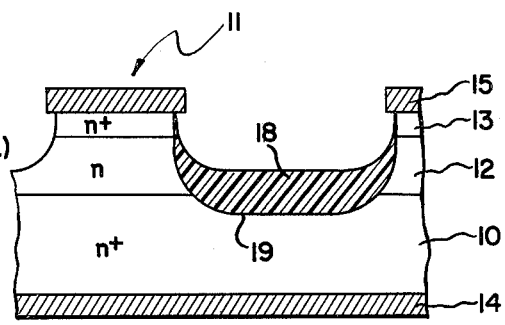
FIGS. 5-9 are a series of schematic cross sectional diagrams illustrating steps in the fabrication of the device in FIGS. 2 and 3.
Figure 5:
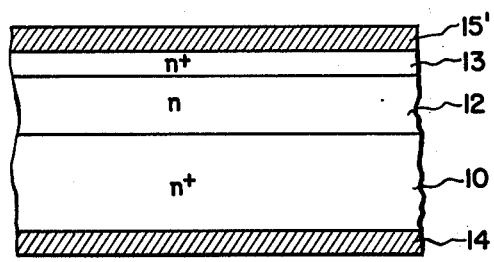

The alternative form of electronically blocking contact in FIG. 4 has an insulated gate structure in which insulating layer 18' extends upwardly along the sides of groove 19 such that there is a clearly defined insulating layer between the adjacent edge of gate metallization 20 and the edge of channel region 12. This helps to prevent shorting of the gate metal to heavily doped outer semiconductor layer 13 which, because the field effect transistor is a symmetric device, can be either the drain region or source region. In the latter case, here illustrated, substrate 10 is now the drain region, metallization 14 is the drain electrode, and metallizations 15 are the source electrodes and are grounded. It may be noted that the heat sink upon assembly to the active device can have a ground plane function.

FIGS. 5-9 depict the main steps in the fabrication, according to one process, of the n-channel vertical field effect transistor in FIGS. 2 and 3. On the surface of n+ gallium arsenide substrate 10 of a few mils thickness is grown an n-type epitaxial layer 12 having a thickness equal to the selected channel length (approximately 1-5 microns), and another n+ epitaxial layer of a few microns thickness is grown on top. The doping density of n+ layers 10 and 13 is, for instance, approximately $2 \times 10^{18}$ cm$^{-3}$ and that of n layer 12 is approximately $10^{14}$-$10^{17}$ cm$^{-3}$. In general, the doping level and thickness of active layer 12 depends on the frequency. Ohmic contact metallizations 14 and 15' are applied to both sides of the wafer to provide the source and drain electrodes using a suitable metal such as germanium-gold-nickel, gold or aluminum. Upper metallization 15' is then patterned to delineate the parallel elongated drain contacts 15 as shown in FIG. 2. This can be done by photoresist masking and etching.

Figure 8:
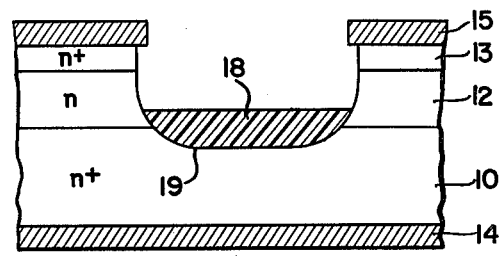
Figure 6:
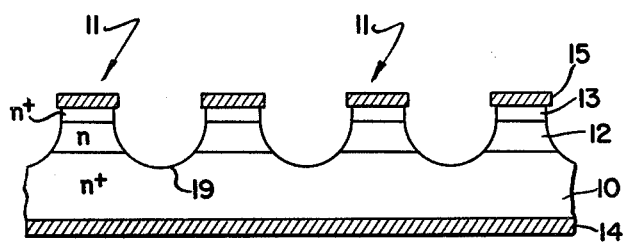
Figure 9:
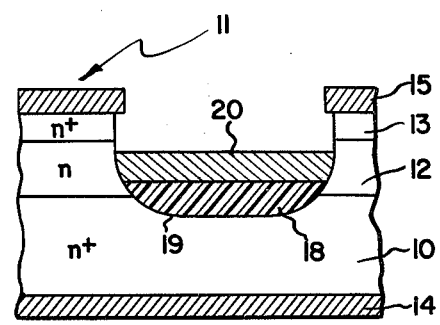

Referring to FIG. 6, mesa structures 11 of a micron or less in width are now formed by chemical etching with the drain pattern serving as a mask. The depth of depressions or grooves 19 is sufficient to extend well into substrate 10. Silicon dioxide is then deposited into grooves 19 by sputtering, so that the cross section of a groove is similar to that shown in FIG. 7. Etching of silicon dioxide can be done accurately; 100 A accuracy is attainable. FIG. 8 illustrates the cross section of the groove after proper etching of insulating layer 18 to remove the unwanted accumulation of silicon dioxide at the edges. In FIG. 9, a gate metal forming an electronically blocking or Schottky junction to gallium arsenide, such as aluminum or gold, has been deposited and etched in a similar manner. The thickness and location of gate metallization 20, of course, are controlled to avoid shorting to source regon 10 and drain region 13.

With the vertical structure here described, it should be evident to those familiar with the device physics of field effect transistor operation that the "vertical" field effect transistor is superior to prior art planar devices for higher power, higher frequency applications. An itemized comparison between the vertical and planar field effect transistor (F.E.T.) is given in Table 1. In FIG. 1, to which this table applies, the source contact is designated at 30; the gate contact at 31; the drain contact at 32; the n+ layers are the source and drain regions; the n layer is the channel region with a height H; $l_g$ is the gate length; S is the gate-drain spacing; and the semi-insulating substrate is labeled.

TABLE 1

| Comparison Between Vertical and Planar F.E.T. | |
| --- | --- |
| Vertical F.E.T. | Planar F.E.T. |
| Two electrodes over a ground plane-a natural stripline circuit configuration. | Three top electrodes-grounding the source is inductance limited. |
| No need for insulating substrate. | Insulating substrate is needed-poor quality material. |
| Better heat sinking without additional circuit problem. | Thick substrate needed to minimize source-drain capacitance leads to poor heat sinking. |
| More tolerant to radiation damage-insulating layer not pertinent in the operation. | Poor tolerance to radiation damage due to insulating substrate. |
| Not limited by gate resistance; makes possible a larger power device. The size of the structure is only limited by phase coherency. | Severely limited by gate resistance. |
| Minimum source-gate resistance, source-gate inductance, and gate-drain resistance parasitics. | Large parisitic series resistance. |
| Well defined $l_g$ and S. | Gate length and other planar distance subject to lithographic errors. |
| Pinch-off in parallel unit transistors is lithography dependent. | Pinch-off is controlled in epitaxial layer thickness. |

In the above table, the last point of comparison represents a disadvantage of the vertical device as compared to the planar device. In addition, it can be added by way of emphasis that the fabrication problems in obtaining high resolution source-gate-drain distances in the planar structure are resolved by the layer thickness control in the vertical structure. However, the instant vertical structure requires good lithography and etching control to form the mesa structure channel regions in order to have a uniform pinch-off voltage. The required lithographic resolution is of the same degree of difficulty as in the planar device, but the effect of poor resolution may be less critical.

The field effect transistor is considered at present to be the most promising microwave active device for high power, high efficiency, and low noise applications. The vertical field effect transistor structure extends the region of field effect transistor applications to even higher power and frequency.

While the invention has been particularly shown and described with reference to several preferred embodiments thereof, it will be understood by those skilled in the art that various changes in form and details may be made therein without departing from the spirit and scope of the invention. For example, for microwave frequency application part of the gate metalization 20 may be etched away so as to reduce the source-gate parasitic capacitance.

The invention claimed is:

1. A field effect transistor comprising
   a first outer heavily doped semiconductor layer upstanding from which is a mesa structure comprising an inner moderately doped semiconductor layer and a second outer heavily doped semiconductor layer, all of said semiconductor layers being of the same conductivity type and one of said outer layers being the source region while the other is the drain region and said inner layer is the channel region,
   contact metallizations on the external opposing surfaces of the outer semiconductor layers,
   an insulating layer attached to the inner surface of said first outer layer surrounding said mesa structure, and
   gate metallization on said insulating layer and surrounding said mesa structure so as to be adjacent to the side edges of said inner semiconductor layer and define an electronically blocking contact to the channel region, said channel region consisting of the entire inner semiconductor layer and extending from edge to edge of the mesa structure without interruption.

2. A field effect transistor according to claim 1 wherein all of said semiconductor layers are made of n-type gallium arsenide and wherein the electronically blocking contact of said gate metallization to the channel region in said mesa structure is a Schottky junction.

3. An interdigitated field effect transistor comprising
   a first outer heavily doped semiconductor layer on which is formed a plurality of parallel elongated mesa structures each comprising an inner moderately doped semiconductor layer and a second outer heavily doped semiconductor layer, all of said semiconductor layers being of the same conductivity type and one of said outer semiconductor layers being the source region while the other is the drain region and said inner layer is the channel region,
   contact metallizations on the external surface of said first outer layer and on the external surface of the second outer layer in each mesa structure, and an interconnection metallization coupling together the contact metallizations on said mesa structures,
   an insulating layer attached to the inner surface of said first outer layer surrounding said mesa structures, and
   gate metallization on said insulating layer and surrounding said mesa structures so as to be adjacent to the side edges of the inner semiconductor layers in said mesa structures and define electronically blocking contacts to the channel regions, said channel regions each consisting of the entire inner semiconductor layer and extending from edge to edge of the mesa structure without interruption.

4. A field effect transistor according to claim 3 wherein all of said semiconductor layers are made of n-type gallium arsenide and wherein the electronically blocking contacts of said gate metallization to the channel regions in said mesa structures are Schottky junctions.

5. A field effect transistor according to claim 4 wherein said insulating layer is continuous and extends into a depression in said first outer semiconductor layer and wherein said gate metallization is a continuous layer of uniform thickness in approximately the same plane as said inner semiconductor layer with the thickness of said gate metallization being no greater than the thickness of said inner semiconductor layer.

6. A field effect transistor according to claim 4 or claim 5 wherein the width of each elongated channel region from edge to edge of the mesa structure is no greater than one micron.

* * * * *